United States Patent [19]

Jones

[11] Patent Number: 4,675,716
[45] Date of Patent: Jun. 23, 1987

[54] INSULATOR COATING FOR IMPROVED STEP COVERAGE IN VLSI DEVICES

[75] Inventor: Gary W. Jones, Sugarland, Tex.

[73] Assignee: Texas Instruments Incorporated, Dallas, Tex.

[21] Appl. No.: 741,207

[22] Filed: Jun. 4, 1985

Related U.S. Application Data

[63] Continuation of Ser. No. 412,325, Aug. 27, 1982, abandoned.

[51] Int. Cl.⁴ .......................................... H01L 23/48
[52] U.S. Cl. ....................................... 357/71; 357/54; 357/68
[58] Field of Search ...................... 357/71, 54, 52, 73, 357/68; 148/DIG. 133

[56] References Cited

U.S. PATENT DOCUMENTS 4,185,294  1/1980  Sumitomo ............................ 357/54

OTHER PUBLICATIONS

RCA Technical Notes, TN#1234, 11/27/79, "Silicon Nitride Isolation of Phosphosilicate Glass Layer".

Primary Examiner—Andrew J. James
Assistant Examiner—Mark Prenty
Attorney, Agent, or Firm—John G. Graham

[57] ABSTRACT

In manufacture of VLSI semiconductor devices, the insulator surface upon which a metallization pattern is deposited is made more smooth by the deposition of a thin insulator in liquid form. This insulator may be silicon oxide deposited from a solution, or otherwise from a liquid carrier, spun on to create thick portions in corners and steep edges, thus promoting improved step coverage. The insulator may be phosphorous-doped so the subsequently-applied thick oxide may be undoped, permitting a two-step wet/dry etch for contact holes, producing sloping sides to reduce metal thinning.

3 Claims, 11 Drawing Figures

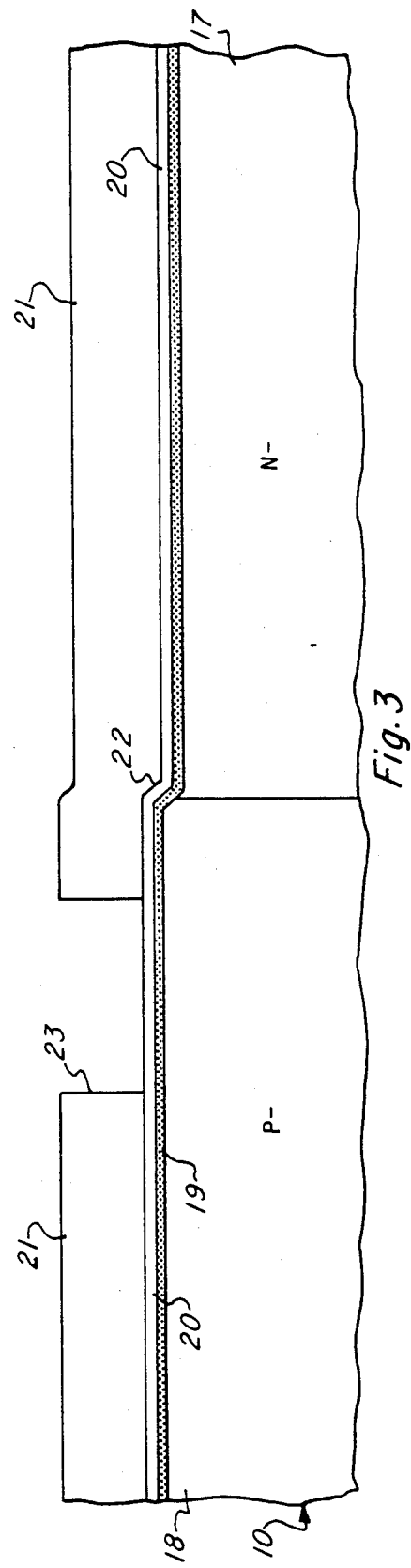

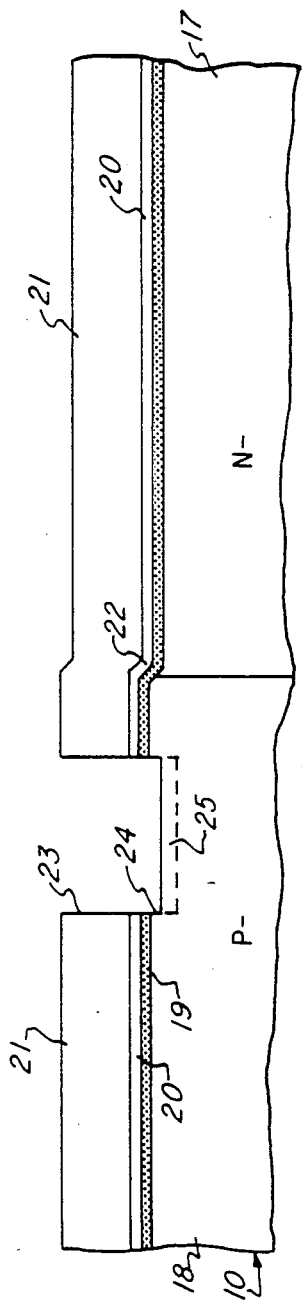
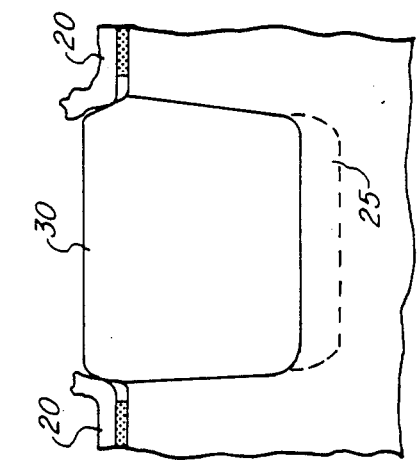
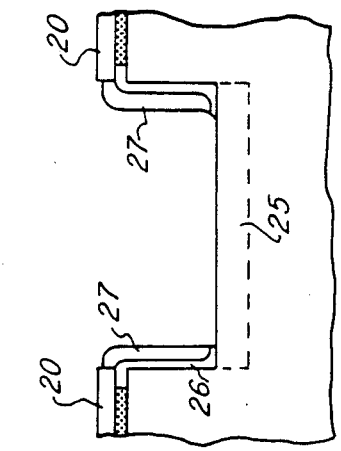
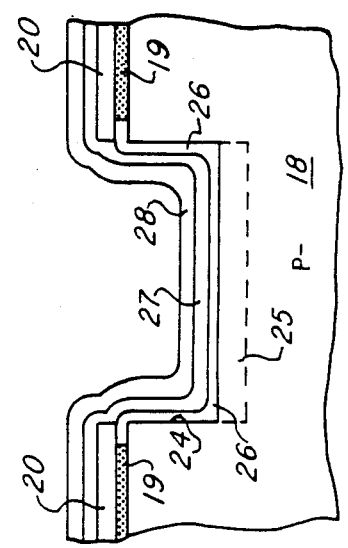

INSULATOR COATING FOR IMPROVED STEP COVERAGE IN VLSI DEVICES

This is a continuation of application Ser. No. 412,325, filed Aug. 27, 1982, and now abandoned.

BACKGROUND OF THE INVENTION

This invention relates to semiconductor devices, and more particularly to improved step coverage for metal contacts and interconnections for semiconductor integrated circuits.

In the past ten years, semiconductor memory devices have increased in density from 4K bit devices designed in 1972 to 256K and 1 megabit devices being designed in 1982, employing semiconductor chips of about the same size. To accomplish this, line resolution has been reduced to about 2 micron or less. In manufacture of these VLSI semiconductor devices, a thin metal coating such as aluminum is deposited and patterned to create contacts and interconnections. Problems occur in thinning of the narrow metal strip at near-vertical steps or sidewalls. Thinner metal at these steps or sidewalls results in higher resistance and a propensity for electromigration failures. Heretofore, the steepness of the sidewalls has been minimized by a "reflow" process, but this necessitates phosphorous-doped silicon oxide and undesirable high temperature operations, as well as larger geometries.

It is the principal object of this invention to provide an improved process for making VLSI type semiconductor integrated circuits; particularly for improving step coverage. Another object is to provide improved semiconductor devices with conductor or metallization patterns which avoid thinning at steps and discontinuities. A further object is to provide improved step coverage and lower resistance for metallization of semiconductor devices.

SUMMARY OF THE INVENTION

In accordance with one embodiment of the invention, in manufacture of VLSI semiconductor devices, the insulator surface upon which a metallization pattern is deposited is made more smooth by the deposition of a thin insulator in liquid form. This insulator may be silicon oxide deposited from a solution, or otherwise from a liquid carrier, spun on to create thick portions in corners and steep edges, thus promoting improved step coverage. The insulator may be phosphorous-doped so the subsequently-applied thick oxide may be undoped, permitting a two-step wet/dry etch for contact holes, producing sloping sides to reduce metal thinning.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 2a is an electrical schematic diagram of the part of the cell array of FIG. 2;

FIGS. 2b and 2c are elevation views in section of the device of FIGS. 1 and 2, taken along the lines b—b and c—c of FIG. 2; and FIGS. 3a–3f are elevation views in section of the part of the chip corresponding to FIG. 1 at successive stages in manufacture.

DETAILED DESCRIPTION OF SPECIFIC EMBODIMENT

Figure 1:
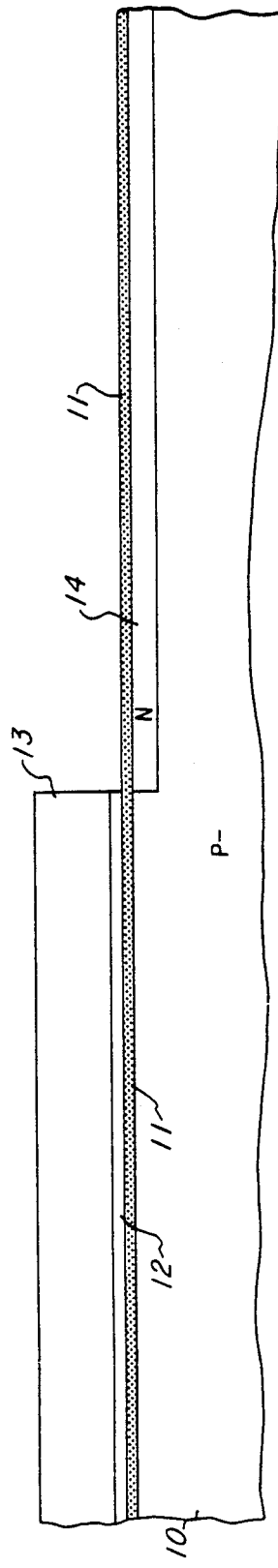
FIG. 1 is a greatly enlarged elevation view in section of a small part of a semiconductor chip made according to the invention.
Figure 2:
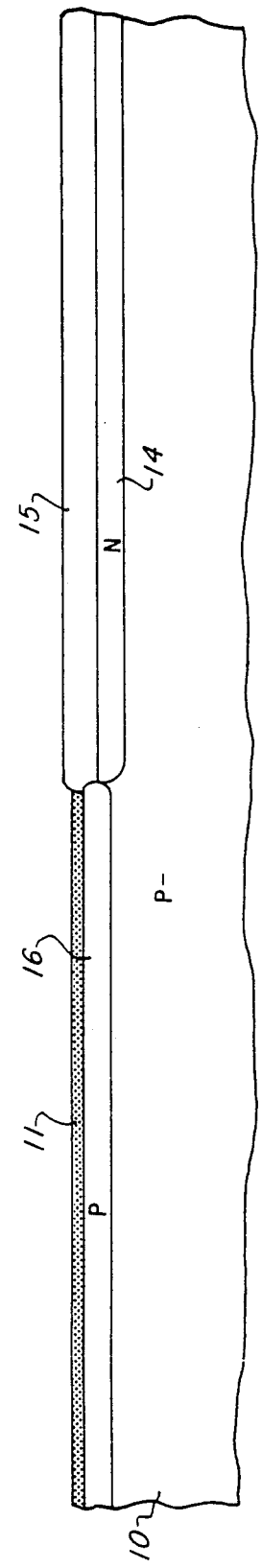
FIG. 2 is a plan view of the part of the chip of FIG. 1.
Figure 8:
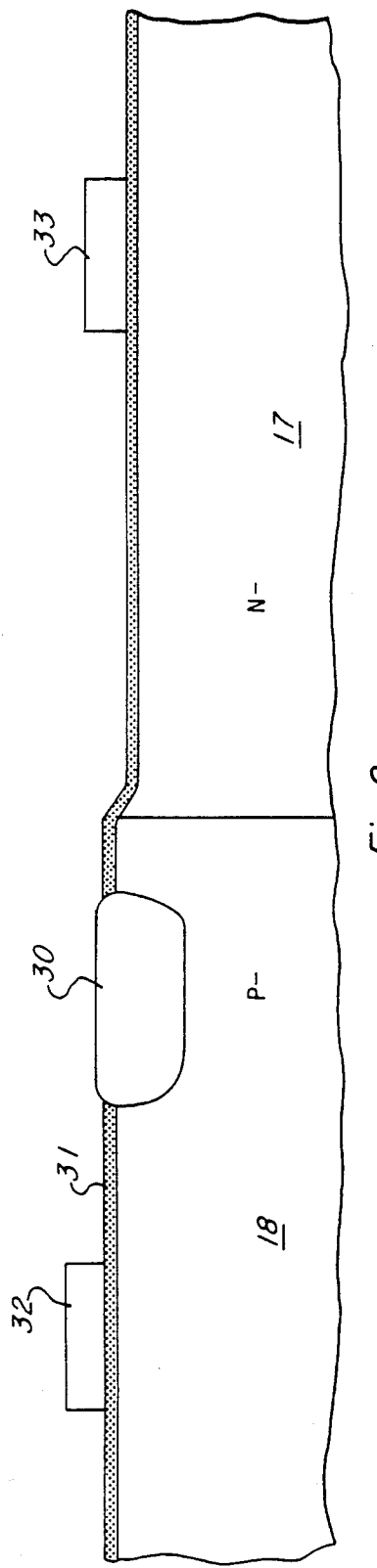
Figure 9:
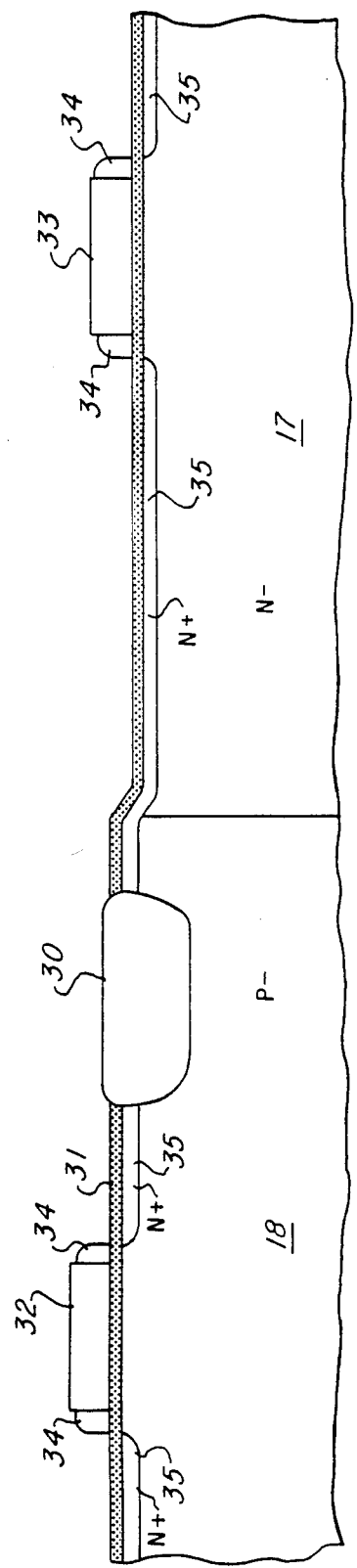
Figure 10:
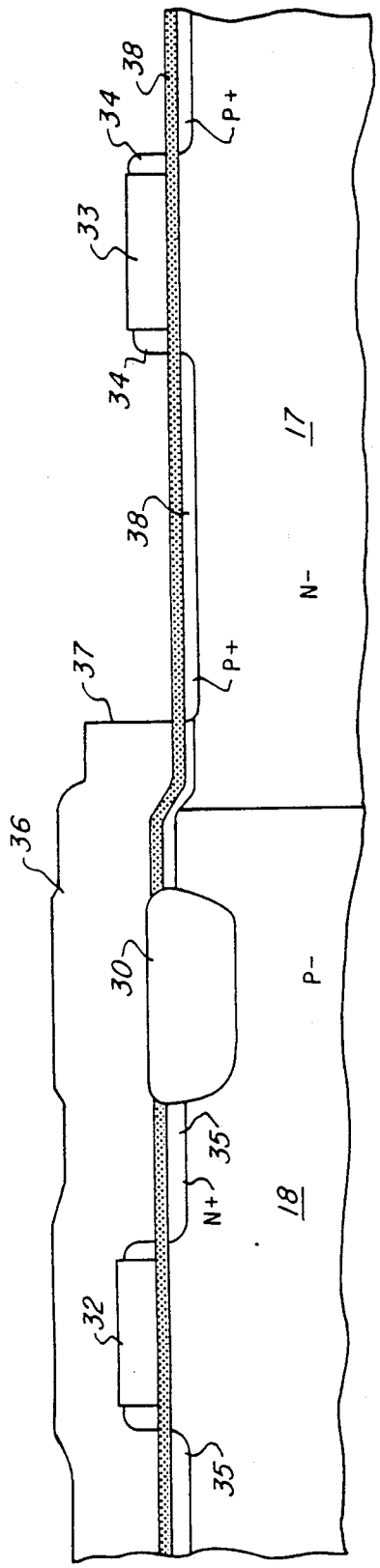
Figure 11:
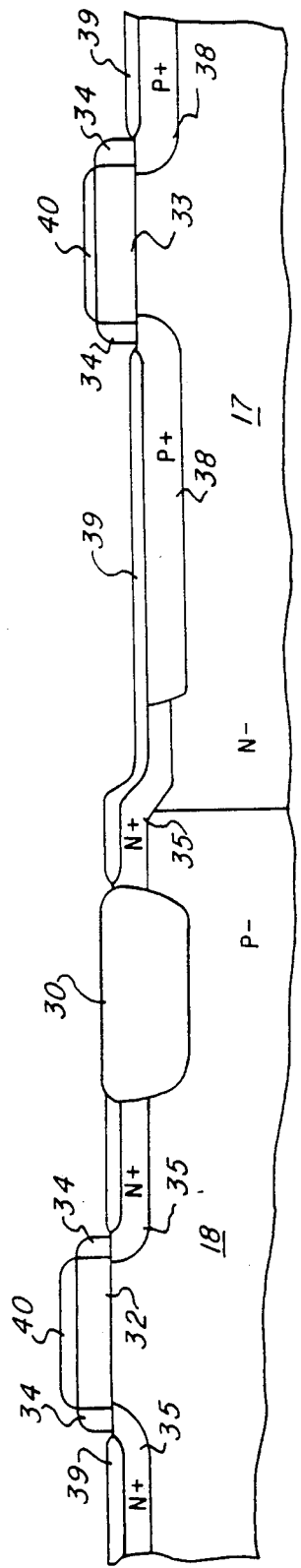
Figure 12:
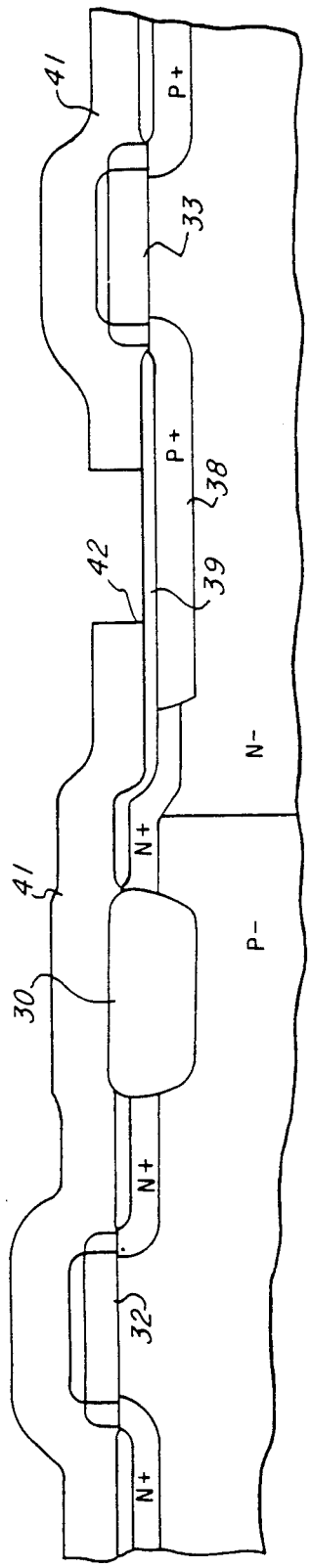
Figure 13:
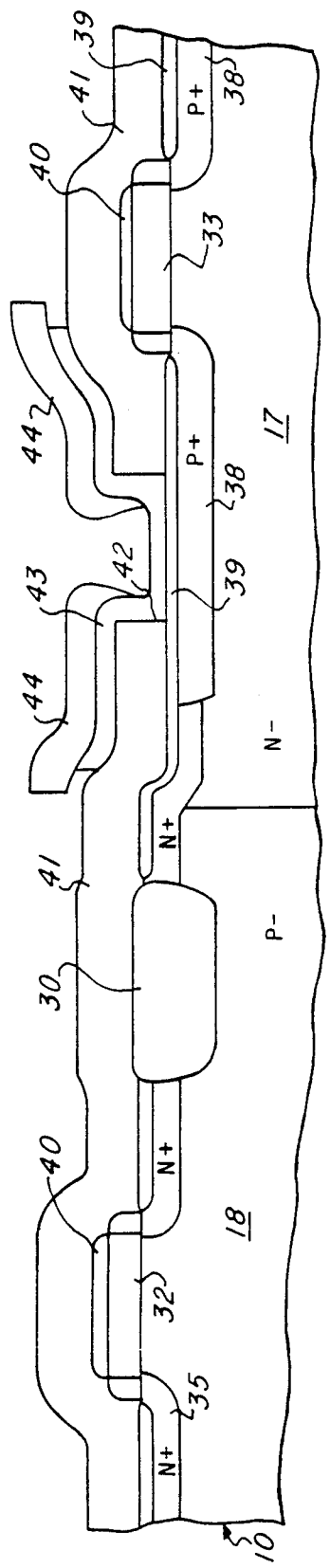

Referring to FIGS. 1 and 2, an array of one-transistor dynamic memory cells is shown as an example of a semiconductor device which may use the oxide process of the invention. A silicon substrate 10 has a transistor 11 and a capacitor 12 formed in one face. The capacitor 12 is created by a first-level polysilicon plate 13 separated from the face by a silicon oxide dielectric 14. The plate 13 is part of a web-like sheet 15 of first-level polysilicon which covers the face except for holes where the transistors are positioned, and this sheet 15 is connected to a supply voltage Vdd of +5 V to create a lower plate for the capacitor, and to create an end of the source-to-drain path of the transistor 11, by inverting the surface of the silicon beneath the dielectric 14. The transistor 11 consists of a second-level polysilicon gate 16 and this gate is covered by a molybdenum silicide layer 17 to lower the resistance of the row line 18 which forms the gates for all of the transistors in a row of like cells. The source/drain on one side of the transistor 11 is an N+ region 18 with a more lightly doped N− region 19 to bridge the gap beneath a sidewall oxide spacer 20. The gate 16 is separated from its underlying channel by a thin gate insulator 21, and the channel is implanted with P type impurity in a region 22 to set the threshold to the proper level. The gate 16 is separated from the first-level poly 13 by a thermal oxide layer 23 grown at the same time as gate oxide 21. Thick thermally-grown field oxide 24 surrounds the capacitor and transistor on the face of the chip 10 and P+ channel stop regions 25 underlie all of the field oxide. A metal strip 26 extends along the face to make contact to the N+ regions 18 for each adjacent pair of cells at a contact area 27, creating a "bit" line or column line. A thick layer 28 of silcion oxide or other insulator deposited at low temperature serves to insulate the metal level from the poly layers, and an aperture 29 in this layer has graded sidewalls to avoid steep discontinuities which would cause thinning of the metal 26.

According to the invention, a layer 30 of a liquid-deposited insulator applied prior to the multilevel oxide 28 functions to make the surface smoother by filling in sharp corners and crevices by thickened regions 31. This layer 30 is preferably composed of silicon oxide containing about 2 to 8% phosphorous; the layer 30 is applied in liquid form with a solvent, and spun on so that the thickened areas 31 are created. The thickness in flat areas is about 800 Å, but diagonal thickness in the areas 31 is about 3000 Å or more. The use of the phosphorous-doped oxide 30 applied in liquid form increases the step coverage for the metal strip 26 because the surface of the multilevel oxide 28 is more smooth. The low temperature application of the layer 30 allows for better control of the channel lengths of the transistor 11 and avoids disturbing the siliciding. Phosphorous, which causes metal corrosion, is relatively well sealed from the metal 26 along the majority of the surface of the oxide 28, yet phosphorous in the layer 30 provides good metal ion migration protection. The multilevel oxide 28 can be plasma-deposited undoped oxide, rather than phosphorous-doped glaze, and this is advantageous because it is a better insulator and exhibits a lower defect density; the etch rates, wet and dry, are very uniform and controllable for this type of oxide 28. Thus, a two-step etch process is used to provide an advantageous slope to the aperture 29; first, a wet etch creates a wide opening due to undercut, then a dry plasma-type etch creates the remainder of the hole so that the sidewalls are more smoothly sloped and discontinuities in the metal 26 are minimized.

Turning now to FIGS. 3a–3d, a process for making a semiconductor device such as a dynamic RAM cell array according to the invention will be described. The starting material is a slice of P-type monocrystalline silicon, typically about four inches in diameter, cut on the <100> plane, of suitable resistivity. The slice may be P− epitaxial meterial on a P+ substrate as set forth in Electronics, p. 93, Feb. 1981. As mentioned above, in the Figures the portion shown of the bar 10 represents only a very small part of the slice, less than one mil wide. After appropriate cleaning, the slice is oxidized by exposing to oxygen in a furnace at an elevated temperature of over 1000° C. to produce an oxide layer 31 over the entire slice of a thickness of about 1000 Å, as seen in FIG. 3a. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 24 and the P+ channel stops 25. The resist is developed, leaving areas where nitride is then removed by etching the exposed part of the nitride layer 32 but leaving in place the oxide layer 31.

Using photoresist and nitride as a mask, the slice is subjected to an implant step to produce the channel stop regions; to this end boron atoms are introduced by ion implant into unmasked regions 33 of silicon. The regions 33 will not exist in the same form in the finished device, because silicon will be consumed in the field oxidation procedure. Usually the slice is subjected to a heat treatment after the boron implant but prior to field oxide growth, as set forth in U.S. Pat. No. 4,055,444 issued to G. R. Mohan Rao, assigned to Texas Instruments.

The next step in the process is the formation of field oxide 24 by subjecting the slices to steam or an oxidizing atmosphere at about 1000° C. for several hours. This causes a thick field oxide layer 24 to be grown as seen in FIG. 3b, extending into the silicon surface as silicon is consumed upon oxidation. The remaining parts of the nitride layer 32 mask oxidation. The thickness of this layer 24 is about 10,000 Å, part of which is above the original surface and part below. The boron doped P+ regions 33 formed by implant are partly consumed, but also diffuse further into the silicon ahead of the oxidation front to produce reduced concentration P+ field stop regions 25 which are much deeper than the original regions 33.

Next the remaining nitride layer 32 is removed by an etchant which attacks nitride but not silicon oxide, then the oxide 31 is removed by etching and the exposed silicon cleaned. The silicon oxide 14 used for the capacitor dielectric is grown by thermal oxidation to a thickness of about 200 to 400 Å.

As seen in FIG. 3b, a first layer 15 of polycrystalline silicon is deposited over the entire slice in a reactor using standard techniques to a thickness of about 5000 Å. This layer is doped with phosphorous by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates 13 and strips 15 in the cell array. The threshold voltage of the enhancement mode transistors in the cell array or in the periphery of the chip are adjusted by a masked ion implant; boron is implanted at a relatively low dosage in the area 34, using a photoresist mask, then driven in by subsequent heat treatment to create the region 22.

Referring to FIG. 3c, the exposed oxide 14 is removed, and the upper surface of the first level polysilicon 13 and 15 as well as exposed silicon is oxidized by exposing the slice to an oxidizing atmosphere at 900° to 1000° C. to create the second thin thermal oxide layer 21 over the channel of the transistor 11 and the thicker layer 23 over the capacitor gate 13 and 15. This oxide has a thickness of about 400 Å over the silicon surface but grows thicker over polysilicon 13 and 15; also it is noted that the oxide will be thicker under the edge of the gate 15 at the area 35 due to oxygen diffusion beneath the edge and oxidation of the underside.

Referring to FIG. 3d, a second level of polycrystalline silicon 16 is next deposited over the slice using standard techniques, to a thickness of about 2500 Å, and then a layer 17 of molybdenum silicide is deposited on top of the second level poly, also to a thickness of about 2500 Å. These layers are masked by photoresist and etched to leave the segments which form the transistor gates 16, 17.

To create the sidewall spacer 20, a layer 36 of silicon oxide is now deposited over the entire slice as seen in FIG. 3d, and then subjected to anisotropic etch to remove this oxide on all horizontal surfaces, leaving the sidewall oxide 20 at all vertical or steep surfaces. The oxide 23 is thinned where not covered by the second-level poly, and thermal oxide 21 is removed by the etch so it is regrown with the oxide 37.

Referring to FIG. 3e, the arsenic implant is performed at a dosage in the order of $10^{16}$ ions/cm$^2$, masked by the polysilicon gates 13 and 16, as well as the sidewall oxide 20, to produce the source/drain N+ region 18. A lower dosage phosphorous implant, 1 to $5 \times 10^{15}$, is then performed to create the reach-through region 19 and provide a lightly-doped graded-junction drain-to-channel interface for the reasons set forth in Journal of Solid-State Circuits, April 1982, p. 200. A heat treatment drives in these implants. The exposed moly silicide is thermally oxidized prior to the implants, producing a layer 37 to prevent outdiffusion of impurities which would enter the region 18, and to prevent build-up of charge by the implant, which could cause failures in the thin oxide 21.

The next step is the application of the oxide layer 30 according to the invention. This oxide is applied in the form of a liquid, i.e., silicon hydroxide with solvent, and mixed with phosphorous pentoxide to provide the phosphorous content. One example of a suitable composition is about 68% ethyl alcohol, 23% ester, 1% carboxylic acid, and about 8% silicon hydroxide. To this is added a trace of $P_2O_5$, enough to produce about 3% phosphorous to $SiO_2$ by weight in the layer 30. In the baking treatment, the silicon hydroxide produces silicon dioxide and water. The alcohol and ester function as a carrier, and are of course evaporated during baking. The carboxylic acid functions to keep the solution acidic. The Si(OH)$_4$ can be in the range of about 5% 9% by weight in the starting solution. The solution is applied to the slice in a quantity to produce a layer 30 of about 800 Å on a smooth level surface, and the slice is spun to distribute the liquid. A two step application with bake between coatings, spinning clockwise after first and counterclockwise after second, may provide more desirable coverage. The liquids are removed by baking at about 450° C. for an hour in nitrogen.

The important feature of the application of the coating 30 is the creation of the thickened corner regions 31 to promote better step coverage, i.e., a smoother surface on the thick oxide beneath the metallization. The oxide 30 tends to be thicker near any corner or discontinuity. If two 10K Å thickness poly lines are 2 microns apart on the surface, the thickness of the layer 30 between the two will not be less than 1500 Å, and the diagonal thickness in the corners will be 4000 Å, illustrating that the effect is greater for more discontinuity.

Referring to FIG. 3f, a thick layer 28 of silicon oxide is next deposited by a plasma process which provides an undoped oxide. This layer 28 insulates the metal level from the layers of polycrystalline silicon, and is referred to as multilevel oxide. The surface of multilevel oxide layer 28 is subjected to an argon implant at 50 kev, $5 \times 10^{14}$ dosage to promote the two-step formation of the hole 29. The oxide 28 is patterned by a photoresist and two-step etch operation to expose the contact area 27 for metal-to-silicon contact along the bit line 26 in the cell array (and contact areas for a metal-to-silicon or metal-to-poly contact for peripheral devices). First, with patterned photoresist 38 in place, a wet etch is performed to remove material exposed by a hole 39 in the photoresist to a depth of about 5000 Å to create a depression 40 in the oxide 28 shown by dashed lines in FIG. 3f; this etch will undercut the photoresist 38 to provide sloping sides 41. Then, an anisotropic dry etch such as a reactive ion etch, or plasma etch as in U.S. Pat. No. 4,291,162, is performed to produce more nearly vertical sidewalls 42 as seen by dotted lines to expose the contact area 27. This two-step etch would not be possible with standard oxide.

The metal contacts and interconnections are then made in the usual manner by depositing a thin film of aluminum or silicon-doped aluminum over the entire top surface of the slice then patterning it by a photoresist mask and etch sequence. This leaves the metal strips 26.

A thick protective oxide layer (not shown) covers the metallization, with apertures etched in this layer above bonding pads. This layer is non-thermal oxide, deposited at low temperature in accord with standard MOS manufacturing methods. Usually this covers everything except the bonding pads on a bar.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising a body of semiconductor material having a circuit element on a face thereof and a vertical-walled step on said face, and having a flat area of the face spaced from said step, an insulating coating extending along said face over said flat area and across said step, said coating being substantially thicker in the corner of the low edge of the vertical-walled step than at said flat area of the face to thereby smooth the discontinuity created by the vertical-walled step, and a conductive interconnecting strip extending along the face above said flat area and across said step, the minimum thickness of the coating in said corner being much greater than the thickness of the coating at said flat area, and a layer of undoped silicon oxide on said face interposed between said conductive strip and said insulating coating wherein said insulating coating includes an anisotropically-etched silicon oxide segment on the vertical wall of said step.

2. A device according to claim 1 wherein the conductive material is metal, and the semiconductor body is silicon.

3. A device according to claim 1 wherein the insulating coating is phosphorous-doped.

* * * * *